(12) United States Patent
Leu et al.

(10) Patent No.: US 7,086,451 B2
(45) Date of Patent: Aug. 8, 2006

(54) HEAT SINK WITH CARBON NANOTUBES AND METHOD FOR MANUFACTURING SAME

(75) Inventors: Charles Leu, Fremont, CA (US);
Tai-Cherng Yu, Tu-chen (TW);
Ga-Lanee Chen, Fremont, CA (US);
Jyh-Chain Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/901,737

(22) Filed: Jul. 28, 2004

(65) Prior Publication Data

US 2005/0092464 A1 May 5, 2005

(30) Foreign Application Priority Data

Nov. 4, 2003 (TW) ............................. 92130734 A

(51) Int. Cl.
*F28F 7/00* (2006.01)
(52) U.S. Cl. ..................... 165/80.3; 165/185
(58) Field of Classification Search .............. 165/80.3, 165/80.4, 80.5, 185; 361/704
See application file for complete search history.

(56) References Cited

U.S. PATENT DOCUMENTS

| | | | |
|---|---|---|---|
| 6,350,488 B1 | 2/2002 | Lee et al. | |
| 6,407,922 B1 | 6/2002 | Eckblad et al. | |
| 6,730,731 B1 * | 5/2004 | Tobita et al. | 524/495 |
| 6,831,359 B1 * | 12/2004 | Heilbronner | 257/720 |
| 6,856,016 B1 * | 2/2005 | Searls et al. | 257/720 |
| 6,965,513 B1 * | 11/2005 | Montgomery et al. | 361/687 |
| 2004/0265489 A1 * | 12/2004 | Dubin | 427/212 |
| 2005/0238810 A1 * | 10/2005 | Scaringe et al. | 427/249.1 |

OTHER PUBLICATIONS

Savas Berber, Young-Kyun Kwon, and David Tomanek: Unusually High Thermal Conductivity of Carbon Nanotubes; p. 4613, vol. 84, Physical Review Letters 2000.
Shoushan Fan, Michael G. Chapline, Nathan R. Franklin, Thomas W. Tombler, Alan M. Cassell, and Hongjie Dai; Self-Oriented Regular Arrays of Carbon Nanotubes and Their Field Emission Properties; pp. 512-514, vol. 283, Science 1999.
Liang Liu and Shoushan Fan; Isotope Labeling of Carbon Nanotubes and Formation 12C-13C Nanotubes Junctions: pp. 11502-11503, vol. 123, J. Am. Chem. Soc. 2001.

* cited by examiner

*Primary Examiner*—Teresa J. Walberg
(74) *Attorney, Agent, or Firm*—Wei Te Chung

(57) ABSTRACT

A heat sink (11) includes a base (12), a plurality of fins (14) extending from a first surface of the base, and a plurality of carbon nanotubes (18) formed on an opposite second surface (16) of the base. The carbon nanotubes are substantially parallel to each other and substantially perpendicular to the base. A method for manufacturing the heat sink includes the steps of: (a) providing a heat sink preform comprising a base and a plurality of fins extending from a first surface of the base; (b) polishing an opposite second surface of base; (c) depositing a catalyst film on the second surface of the base; and (d) providing a carbon source gas to grow a plurality of carbon nanotubes on the second surface of the base.

10 Claims, 4 Drawing Sheets

HEAT SINK WITH CARBON NANOTUBES AND METHOD FOR MANUFACTURING SAME

BACKGROUND OF THE INVENTION

1. Field of the Invention

The invention relates generally to heat sinks and manufacturing methods thereof; and more particularly to a kind of heat sink which conducts heat by employing carbon nanotubes, and a manufacturing method thereof.

2. Description of Related Art

Electronic components such as semiconductor chips are becoming progressively smaller, while at the same time heat dissipation requirements thereof are increasing. Commonly, a thermal interface material is utilized between the electronic component and a heat sink in order to dissipate heat generated by the electronic component.

A conventional thermal interface material is obtained by diffusing particles with a high heat conduction coefficient in a base material. The particles can be graphite, boron nitride, silicon oxide, alumina, silver, or other metals. However, the heat conduction coefficient of the thermal interface material is now considered to be too low for many contemporary applications, because it cannot adequately meet the heat dissipation requirements of modem electronic components.

A new kind of thermal interface material has recently been developed. The thermal interface material is obtained by fixing carbon fibers with polymer. The carbon fibers are distributed directionally, and each carbon fiber can provide a heat conduction path. A heat conduction coefficient of this kind of thermal interface material is relatively high. However, the heat conduction coefficient of the thermal interface material is inversely proportional to a thickness thereof, and the thickness is required to be greater than 40 micrometers. In other words, the heat conduction coefficient is limited to a certain value corresponding to a thickness of 40 micrometers. The value of the heat conduction coefficient cannot be increased, because the thickness cannot be reduced.

In 1991, carbon nanotubes was discovered. A length of a carbon nanotube can be several thousand times its diameter. A tensile strength of carbon nanotubes can be one hundred times that of steel. A weight of carbon nanotubes is only one sixth of that of steel. Furthermore, carbon nanotubes have good flexibility and excellent heat conduction coefficients. Thus, carbon nanotubes have excellent characteristics for thermal conduction applications. An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600W/mK (watts/milliKelvin) at room temperature.

U.S. Pat. No. 6,407,922 discloses a thermal interface material employing carbon nanotubes. The thermal interface material is formed by injection molding, and has a plurality of carbon nanotubes incorporated in a matrix material. A first surface of the thermal interface material engages with an electronic device, and an opposite second surface of the thermal interface material engages with a heat sink. The second surface has a larger area than the first surface, so that heat can be uniformly spread over the larger second surface.

However, the thermal interface material is formed by injection molding. The thermal interface material is relatively thick, and has reduced flexibility. In addition, the carbon nanotubes are disposed in the matrix material randomly and multidirectionally. This means that heat does not necessarily spread uniformly through the thermal interface material. Furthermore, heat does not necessarily spread directly from the first surface engaged with the electronic device to the second surface engaged with the heat sink.

A new heat sink with carbon nanotubes which overcomes the above-mentioned problems and a method for manufacturing such heat sink are desired.

BRIEF SUMMARY OF THE INVENTION

Accordingly, an object of the present invention is to provide a heat sink having an excellent thermal contact interface.

Another object of the present invention is to provide a method for manufacturing the above-described heat sink.

To achieve the first of the above-mentioned objects, the present invention provides a heat sink comprising a base, a plurality of fins extending from a first surface of the base, and a plurality of carbon nanotubes formed on an opposite second surface of the base. The carbon nanotubes are substantially parallel to each other and substantially perpendicular to the base.

To achieve the second of the above-mentioned objects, a method for manufacturing the heat sink comprises the steps of:

(a) providing a heat sink preform comprising a base and a plurality of fins extending from a first surface of the base;
(b) polishing an opposite second surface of the base;
(c) depositing a catalyst film on the second surface of the base; and
(d) providing a carbon source gas to grow a plurality of carbon nanotubes on the second surface of the base.

The heat sink of the present invention has the following advantages. Firstly, the carbon nanotubes have high tensile strength, good flexibility and excellent heat conduction coefficients. This ensures good physical and thermal contact between the carbon nanotubes and an electronic device, and improves a heat conduction performance of the heat sink. Secondly, when the heat sink is used with the electronic device, other thermal interface materials such as thermal grease are not needed. Further, the carbon nanotubes have a low height. Therefore not only does the heat sink save on materials, it ensures that the combined electronic device and heat sink has reduced bulkiness and weight. Thirdly, the carbon nanotubes are perpendicular to and uniformly formed on the second surface of the base, which ensures that the heat sink conducts heat directly and evenly. Fourthly, an area of distribution of the carbon nanotubes can be varied according to need by controlling an area of distribution of the catalyst film.

Other objects, advantages and novel features of the invention will become more apparent from the following detailed description when taken in conjunction with the accompanying drawings, in which:

DESCRIPTION OF THE PREFERRED EMBODIMENT

Figure 2:
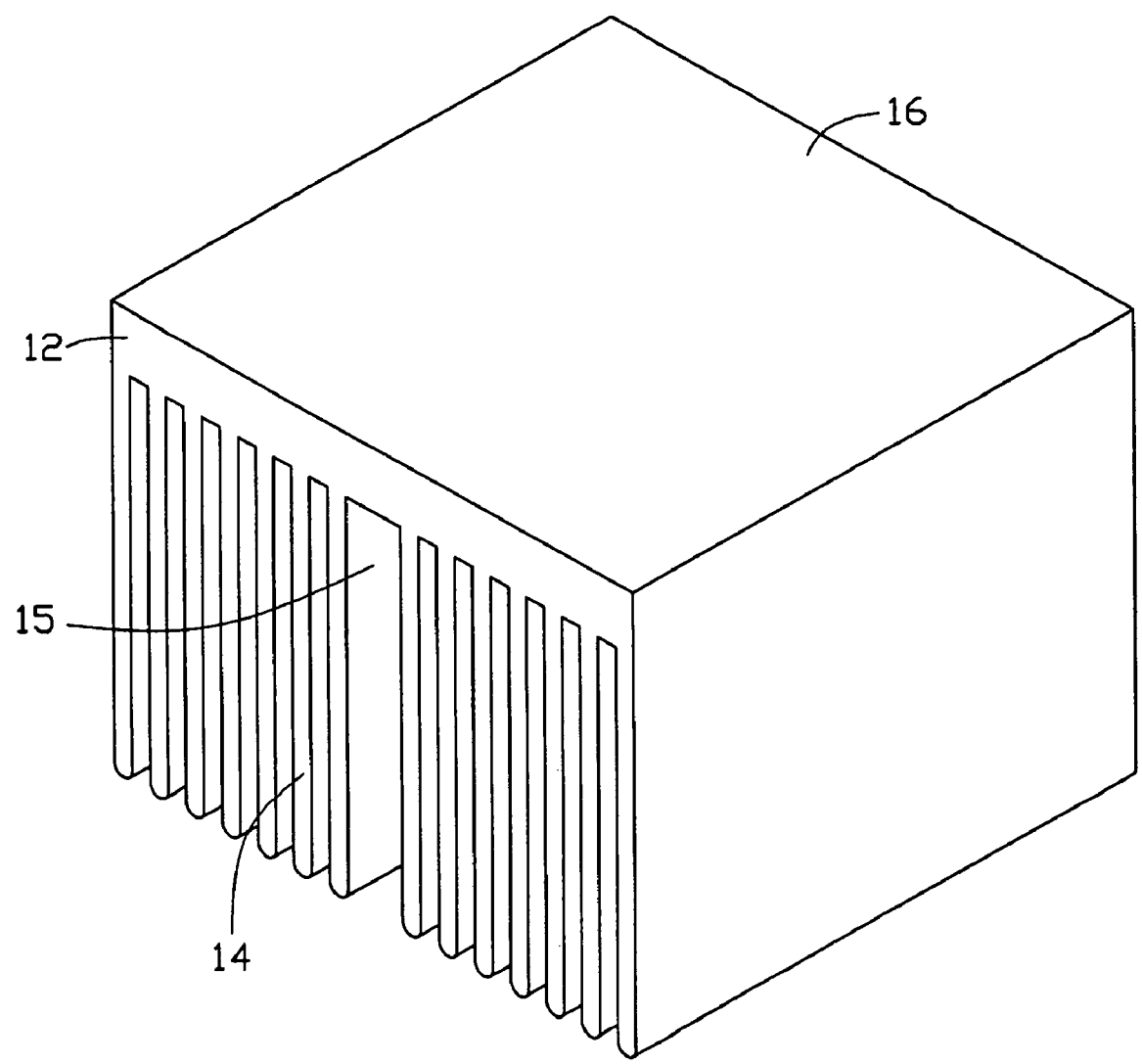
FIG. 2 is an isometric view of a heat sink preform of the present invention, showing the preform inverted and before carbon nanotubes have been formed thereon.
Figure 3:
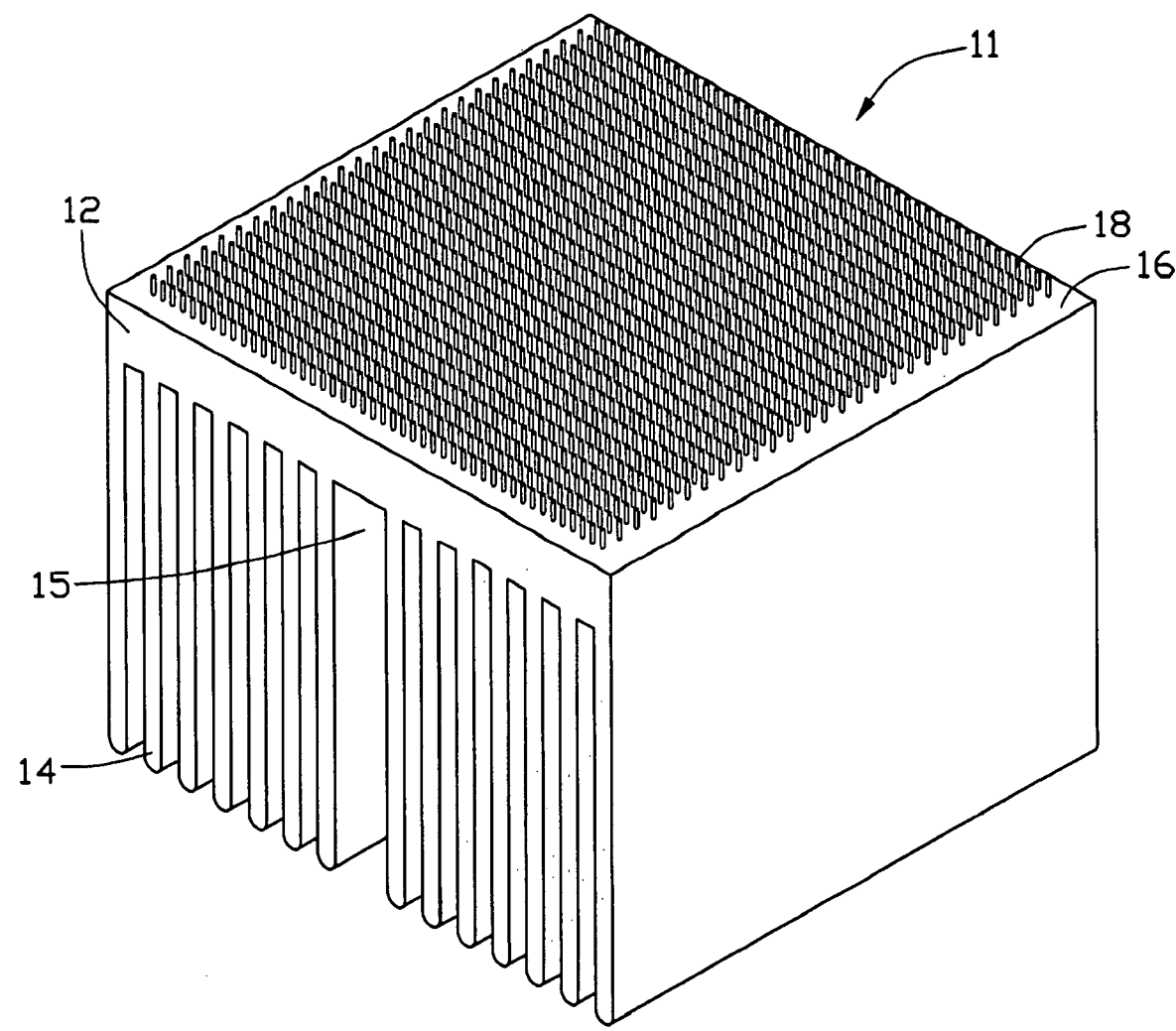
FIG. 3 is similar to FIG. 2, but showing a plurality of carbon nanotubes formed on the heat sink preform, thereby defining the heat sink of the present invention.

Referring to FIGS. 2 and 3, a heat sink 11 of the present invention is shown. The heat sink 11 comprises a flat rectangular base 12, a plurality of fins 14 extending from one surface (not labeled) of the base 12, and a plurality of carbon nanotubes 18 formed on an opposite contacting surface 16 of the base 12. The carbon nanotubes 18 are substantially parallel to each other and substantially perpendicular to the contacting surface 16 of the base 12. A diameter of the carbon nanotubes 18 is in the range from 3 to 40 nanometers. A height of the carbon nanotubes 18 is in the range from 1 to 100 micrometers. The base 12 and the fins 14 are made of aluminum or copper, and are integrally formed in a mold (not shown). The fins 14 are substantially parallel to each other and substantially perpendicular to the base 12. The fins 14 are arranged in two symmetrical groups, with a groove 15 defined between the groups.

Figure 1:
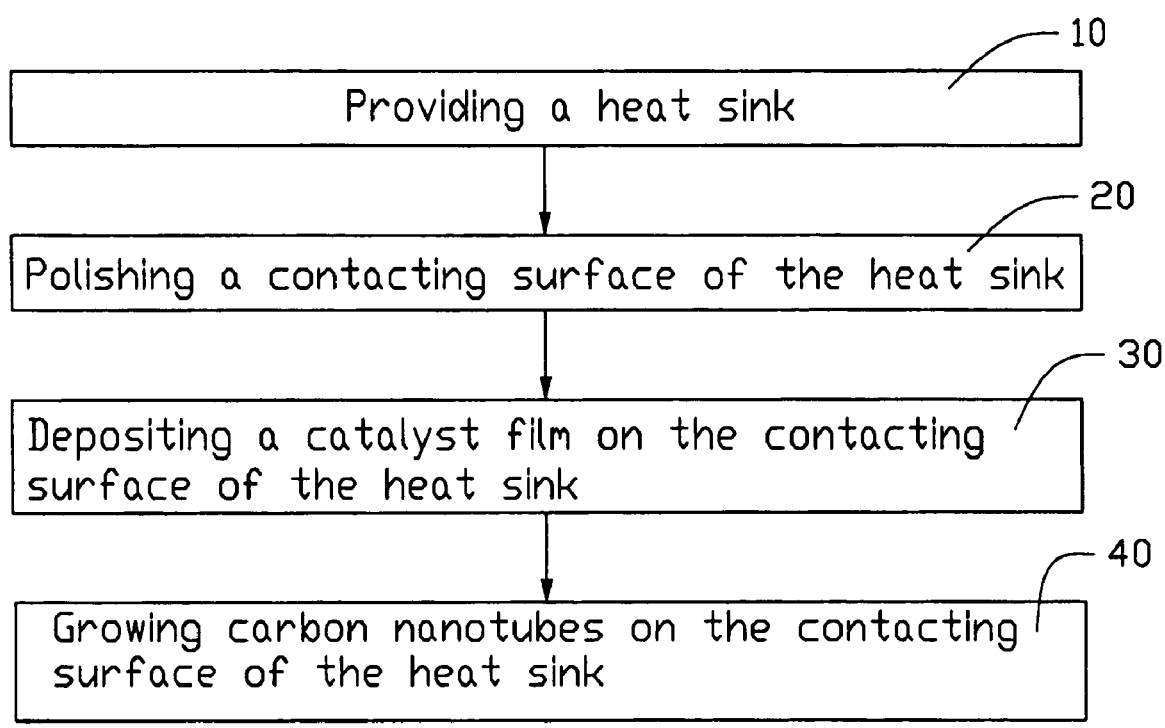
FIG. 1 is a flow chart of manufacturing a heat sink according to the present invention.

FIG. 1 is a flow chart of manufacturing the heat sink 11 according to the present invention. The method comprises the steps of:

step 10: providing a heat sink preform comprising a base 12 and a plurality of fins 14 extending from one surface of the base 12;

step 20: polishing an opposite contacting surface 16 of the base 12 by way of Chemical Mechanical Polishing (CMP) so that a roughness of the contacting surface 16 is in the range from 5 to 10 angstroms, and washing the contacting surface 16;

step 30: depositing a catalyst film on the contacting surface 16 by way of vacuum heat evaporation volatilization or electron beam evaporation, the catalyst film comprising iron (Fe), cobalt (Co), nickel (Ni), rhodium (Rh) or any alloy thereof, and a thickness of the catalyst film being in the range from 5 to 30 nanometers; in the preferred embodiment, the catalyst film being iron (Fe), and a thickness thereof being 10 nanometers; and step 40: growing a plurality of carbon nanotubes 18 on the contacting surface 16.

In step 40, the catalyst film is oxidized to obtain catalyst particles (not shown). Then the contacting surface 16 with the catalyst particles disposed thereon is placed in a reaction furnace (not shown), and a carbon source gas is provided in the reaction furnace at a temperature of 700–1000° C. in order to grow the array of carbon nanotubes 18 by way of low temperature chemical vapor deposition. The carbon source gas can be acetylene or ethene. In the preferred embodiment, a diameter of the carbon nanotubes 18 is 20 nanometers, a height of the carbon nanotubes 18 is 50 micrometers, and a distance between every two adjacent carbon nanotubes 18 is 100 nanometers. Details of the method for growing the carbon nanotubes can be found in pages 512–514, Vol. 283, Science 1999, and in pages 11502–11503, Vol. 123, J. Am. Chem. Soc. 2001. Moreover, U.S. Pat. No. 6,350,488 discloses a method for mass synthesis of arrays of carbon nanotubes. These three publications are incorporated herein by reference.

Figure 4:
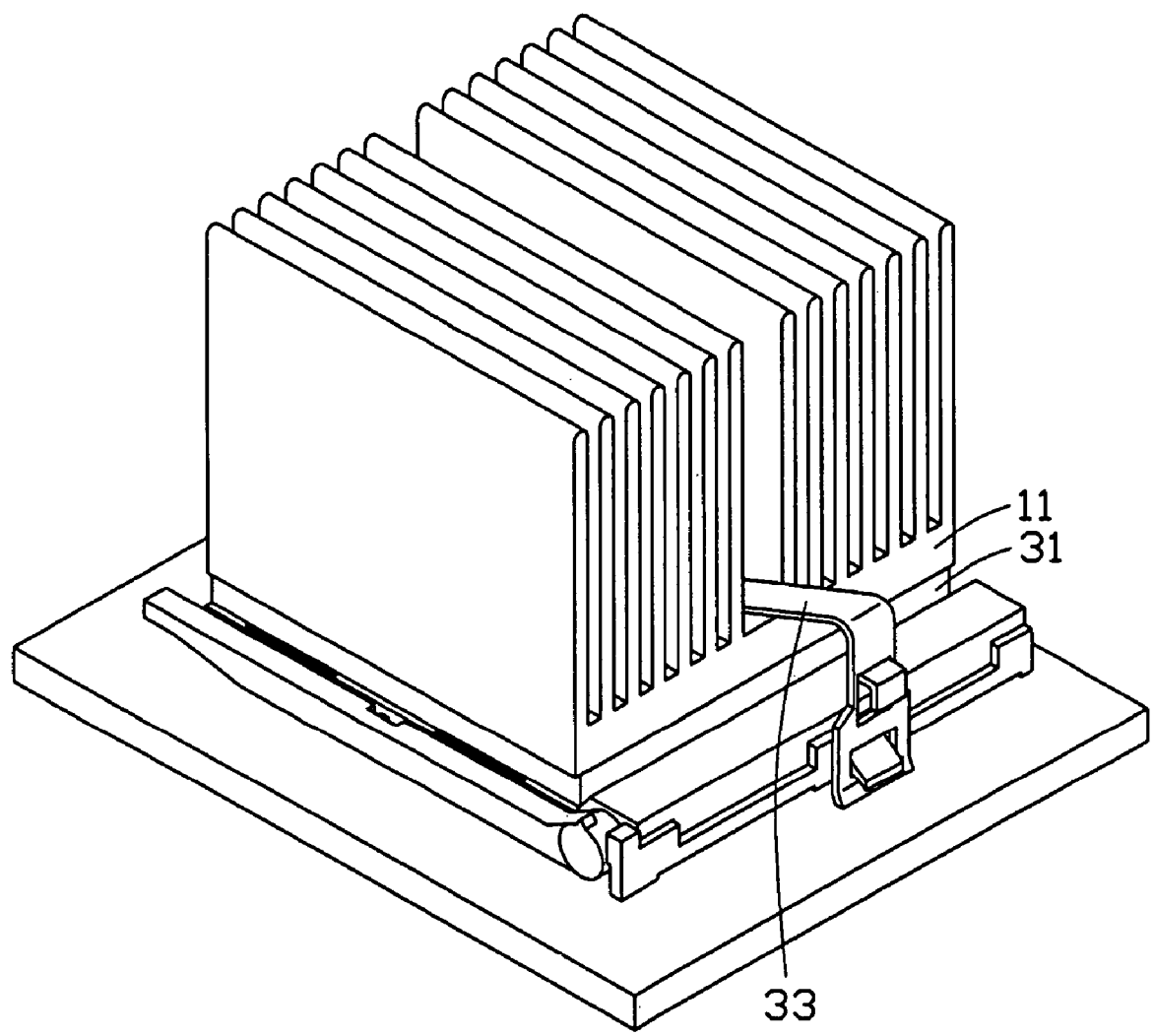
FIG. 4 is an isometric view of the heat sink of the present invention mounted on an electronic device.

FIG. 4 shows the heat sink 11 of the present invention is disposed on a heat-generating electronic device 31. The carbon nanotubes 18 of the heat sink 11 are engaged with a surface (not labeled) of the electronic device 31, and a clip 33 is disposed in the groove 15 to position the heat sink 11 on the electronic device 31.

Comparing with a conventional heat sink, the heat sink 11 of the present invention has the following advantages. Firstly, the carbon nanotubes 18 have high tensile strength, good flexibility and excellent heat conduction coefficients. This ensures good physical and thermal contact between the carbon nanotubes 18 and the electronic device 31, and improves a heat conduction performance of the heat sink 11. In particular, because the height of the carbon nanotubes 18 is on a micron scale and the carbon nanotubes 18 have good flexibility, even if the surface of the electronic device 31 is uneven, the heat sink 11 can still provide good physical and thermal contact with the electrical device 31. Secondly, when the heat sink 11 is used with the electronic device 31, other thermal interface materials such as thermal grease are not needed. Further, the carbon nanotubes 18 have a low height. Therefore not only does the heat sink 11 save on materials, it also ensures that the combined electronic device 31 and heat sink 11 has reduced bulkiness and weight. Thirdly, the carbon nanotubes 18 are perpendicular to and uniformly formed on the contacting surface 16 of the heat sink 11, which ensures that the heat sink 11 conducts heat directly and evenly. Fourthly, an area of distribution of the carbon nanotubes 18 can be varied according to need by controlling an area of distribution of the catalyst film. It is understood that the above-described embodiment is intended to illustrate rather than limit the invention. Variations may be made to the embodiment without departing from the spirit of the invention. Accordingly, it is appropriate that the appended claims be construed broadly and in a manner consistent with the scope of the invention.

What is claimed is:

1. A heat sink comprising:
   a base;
   a plurality of fins extending from one surface of the base; and
   a plurality of carbon nanotubes grown on and thereby in contact with an opposite surface of the base;
   wherein the carbon nanotubes are substantially parallel to each other and substantially perpendicular to the base.

2. The heat sink as claimed in claim 1, wherein the base and the fins are integrally formed in a mold.

3. The heat sink as claimed in claim 1, wherein the base and the fins comprise aluminum or copper.

4. The heat sink as claimed in claim 1, wherein the fins are substantially parallel to each other and substantially perpendicular to the base.

5. The heat sink as claimed in claim 1, wherein a height of the carbon nanotubes is in the range from 1 to 100 micrometers.

6. The heat sink as claimed in claim 1, wherein diameters of the carbon nanotubes are in the range from 3 to 40 nanometers.

7. A heat sink comprising:
   a base;
   a plurality of fins extending from one surface of the base; and
   a plurality of carbon nanotubes grown on and thereby in contact wit an opposite surface of the base;
   wherein the carbon nanotubes extend opposite to said fins.

8. The heat sink as claimed in claim 7, wherein both said fins and said carbon nanotubes are perpendicular to said base.

9. A heat sink comprising:
   a base;
   a plurality of fins extending from one surface of the base; and
   a plurality of carbon nanotubes grown on and thereby in contact with an opposite surface of the base;
   wherein the carbon nanotubes extend away from hot said base and fins.

10. The heat sink as claimed in claim 9, wherein both said fins and said carbon nanotubes are perpendicular to said base.

* * * * *